United States Patent [19]

Toda et al.

[11] Patent Number: 4,862,420

[45] Date of Patent: Aug. 29, 1989

[54] INTERNAL INTERLEAVING TYPE SEMICONDUCTOR MEMORY DEVICE

[75] Inventors: Haruki Toda, Yokohama; Hiroshi Sahara; Shigeo Ohshima, both of Tokyo, all of Japan

[73] Assignee: Kabushiki Kaisha Toshiba, Kawasaki, Japan

[21] Appl. No.: 171,858

[22] Filed: Mar. 22, 1988

[30] Foreign Application Priority Data

Mar. 27, 1987 [JP] Japan .................................. 62-71617

[51] Int. Cl.$^4$ ...................... G11C 11/40; G11C 13/00
[52] U.S. Cl. .................................... 365/221; 365/182; 365/95; 365/191; 365/239
[58] Field of Search ................. 365/174, 182, 186, 95, 365/189, 230, 190, 191, 203, 207, 221

[56] References Cited

U.S. PATENT DOCUMENTS

| | | | |
|---|---|---|---|
| 3,402,398 | 9/1968 | Koerner et al. | 365/49 |
| 3,691,534 | 9/1972 | Varadi et al. | 365/182 |
| 4,072,932 | 2/1978 | Kitagawa et al. | 365/207 |
| 4,587,637 | 5/1986 | Ishizuka | 365/230 |
| 4,646,272 | 2/1987 | Takasugi | 365/233 |
| 4,656,614 | 4/1987 | Suzuki | 365/230 |
| 4,672,587 | 6/1987 | Geiger | 365/230 |
| 4,685,088 | 8/1987 | Iannucci | 365/230 |

OTHER PUBLICATIONS

Ishimoto et al., "A 256K Dual Port Memory," IEEE International Solid-State Circuits Conference, Digest of Technical Papers, WAM 3.1, pp. 38-39, Feb. 1985.

*Primary Examiner*—Terrell W. Fears
*Attorney, Agent, or Firm*—Finnegan, Henderson, Farabow, Garrett, & Dunner

[57] ABSTRACT

A semiconductor memory device determines the level of a select control signal, according to the level of drive signals for two systems as generated in the preceding access cycle, and the level of the least significant bit of an address to fetch data in a desired serial access cycle. In accordance with this select signal, a select circuit selects one of the drive signals as generated by drive signal generating circuits, and supplies the selected signal to two data selecting/fetching systems. The function of this select circuit allows one of the two data selecting/fetching systems to first start the data access operation.

5 Claims, 5 Drawing Sheets

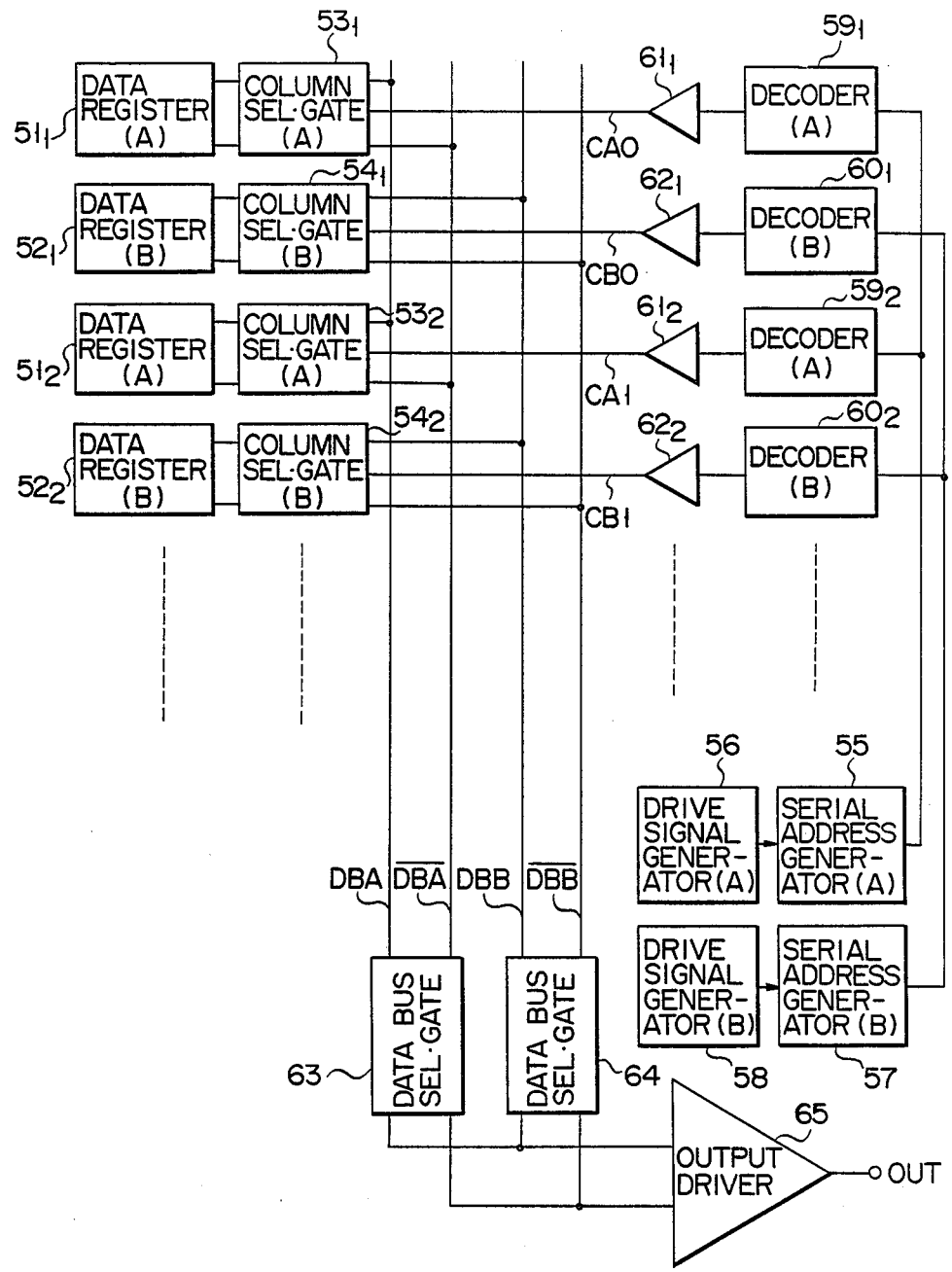
F I G. 1

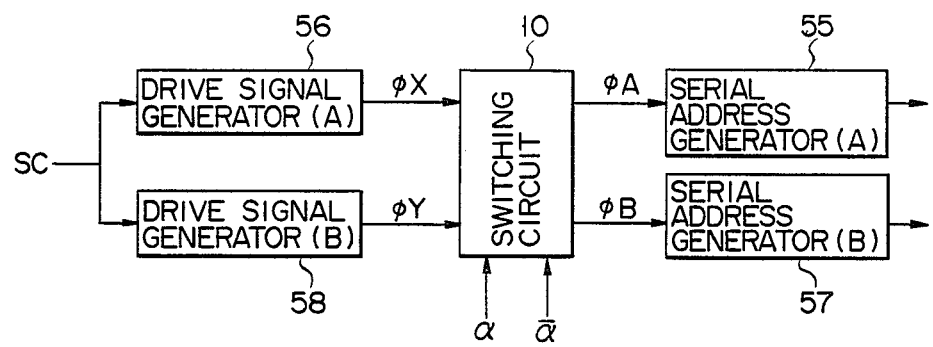
F I G. 3
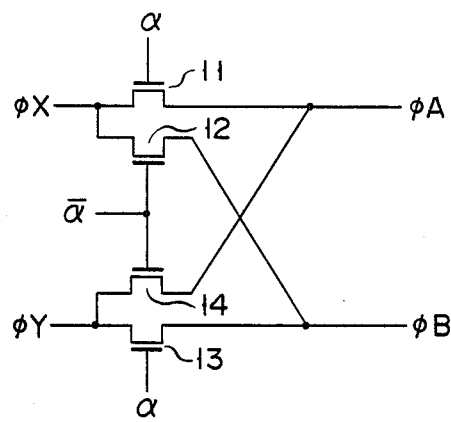
F I G. 4    F I G. 5
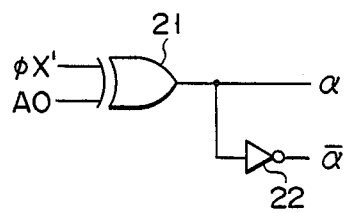
F I G. 6

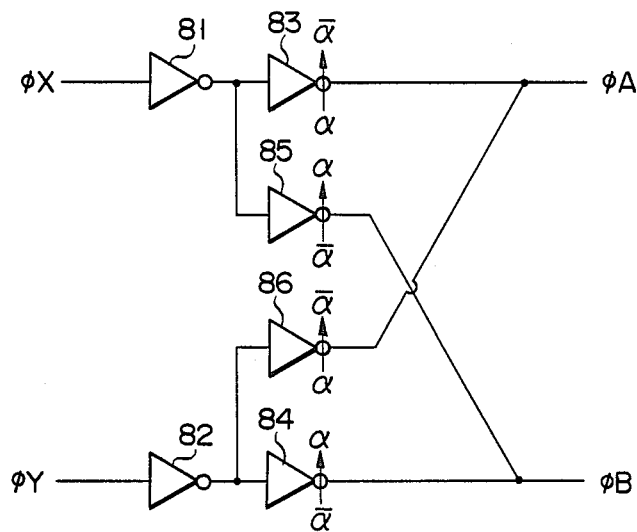
F I G. 8 ized type semiconductor memory device, and more particularly, to a semiconductor memory device of the type where, during the time a given address is being serially accessed, a serial access operation can be performed in relation to another address.

INTERNAL INTERLEAVING TYPE SEMICONDUCTOR MEMORY DEVICE

BACKGROUND OF THE INVENTION

1. Field of the Invention

This invention relates to a serially-accessed type semiconductor memory device, and more particularly, to a semiconductor memory device of the type where, during the time a given address is being serially accessed, a serial access operation can be performed in relation to another address.

2. Description of the Related Art

Serially-accessed type memory devices have been developed which can operate at a high speed. In the memory devices, two data selecting/fetching systems are provided in a single semiconductor chip. When one of the data selecting/fetching systems is outputting data, the other is setting up other data to be output. This type of memory device is also referred to as an interleave type memory device.

FIG. 1 illustrates, in block form, a major part of an interleave type semiconductor memory device which was invented by the author(s) of the present patent application and filed July 25, 1987, bearing U.S. application Ser No. 066,260. In this figure, a system A as one of the two selecting/fetching systems contains data registers $51_1$, $51_2$, ... A system B as the other of those two data selecting/fetching systems contains data registers $52_1$, $52_2$, bit data as previously stored in a memory array (not shown).

Column select gates $53_1$, $53_2$, ... select the data in data register 51 of system A, according to the signals on column select lines CA0, CA1, ... of system A. Similarly, column select gates $54_1$, $54_2$, ... select data in data register 52 of system B, according to the signals on column select lines CB0, CB1, ... of system B. Data buses DBA and $\overline{\text{DBA}}$, incorporated in system A, are supplied with the data selected by column select gate 53, also incorporated in system A. Likewise, data buses DBB and $\overline{\text{DBB}}$, incorporated in system B, are supplied with the data selected by column select gate 54, which is incorporated in system B. A drive signal generator 56 supplies a drive signal to address generator 55. Reference numeral 57 designates a serial address generator in the system B. A drive signal generator 58 in the system B supplies a drive signal to address generator 57. Address decoders $59_1$, $59_2$, ... in the system A are supplied with an output address from serial address generator 55. Address decoders $61_1$, $61_2$, ... in the system B is supplied with the output address from serial address generator 57. Column select gate drivers $61_1$, $61_2$, ... of the system A are supplied with a decoder output of address decoder 59. Column select gate drivers in the system B $62_1$, $62_2$, ... are supplied with the decoder output of address decoders 60, respectively. Data bus select gate 63 selects a data of data bus DBA or $\overline{\text{DBA}}$. Data bus select gate 64 selects a data of data bus DBB or $\overline{\text{DBB}}$. Output driver 65 outputs data OUT.

Drive signal generators 56 and 58 of the systems A and B generate drive signals input to serial address generators 55 and 57, and other drive signals for controlling other circuits of these systems. The other drive signals contains signals to selectively activate column select gates 53 and 54, and data bus select gates 63 and 64. The drive signals generated by those signals generators are not illustrated, for simplicity.

The conventional semiconductor memory shown in FIG. 1 operates as illustrated by timing charts shown in FIGS. 2A to 2D. In this instance, the data access, or the data outputting from the data registers is performed in the order of data registers $51_1$, $51_2$, .... A serial access to be described is for the case of a cycle time to access the data of data register 51 contained in the system A. Specifically, since the preceding cycle is the cycle to access the system B, data bus select gate 63 in the system A is inactive, or in an off state as in step S1 of FIG. 2B. Data bus select gate 64 in the system B is active, or in an on state, as in step S16 of FIG. 2C. In the system B, as shown in the subsequent steps S17 and S18, the data of the data register in the system B, e.g., the data of data register $52_1$, is transferred to output driver 65, via data buses DBB and $\overline{\text{DBB}}$.

In the system A, which is disconnected from output driver 65 in the preceding cycle, an address is set by serial address generator 55, according to the drive signal output from drive signal generator 56 (step S2), address decoder 59 of the system A is selected (S3), and the decoder output renders column select line CA1 active (step S4), and the data of data register $51_2$ is transferred to data buses DBA and $\overline{\text{DBA}}$, as shown in step S5.

When the serial access enters the present cycle, data bus select gate 64 of the system B is made inactive as shown in step S11, and the data bus select gate 63 of the system A is made active as shown in step S6. As a result, the data buses DBA and $\overline{\text{DBA}}$ in the system A are connected to output driver 65, so that the data from data register $51_2$ is transferred to output driver 65, as shown in step S8. Then, it is output from output driver 65. At this time, in the system B which is disconnected from output driver 65, an address is set by serial address generator 57 according to the drive signal, which is output from drive signal generator 58 during the period from step S11 to S15, to select address decoder 60 in the system B. Further, column select line CB1 is made active by the decoder output. As a result, the data in data register $52_2$ is transferred to data buses DBB and DBB bar, thereby completing the set-up for access in the next cycle.

As seen from the foregoing description, the memory device of the interleave type substantially halves the cycle time when comparing with the memory device of other access system, and the access time is remarkably improved.

In the memory device of the interleave type, the circuits in the systems A and B operate at the period, which is twice the period of an external serial access control signal (FIG. 2A) applied to drive signal generators 56 and 58, and these circuits operate with half-period staggered phase. To cause serial address generators 55 and 57 of the systems A and B to set addresses, drive signals with different phases must be generated by drive signal generators 56 and 58. It is assumed now that a serial access control signal applied to drive signal generators 56 and 58 is SC, and that the drive signals of the two systems which are generated by these drive signal generators 56 and 58 and vary at the double period of the period of signal SC, are designated by $\phi X$ and $\phi Y$, respectively. These drive signals $\phi X$ and $\phi Y$ vary like the least significant bit signal of the address for serial access. As a matter of course, the serial address generator 55 of the system A is constantly supplied with drive signal $\phi X$ as generated by the drive signal generator 56 in the system A. Likewise, the serial address generator 57 of the system B is constantly supplied with drive signal $\phi Y$ as generated by the drive signal generator 58 in the system B.

The above serial access system in which the drive signal $\phi X$ of the system A is supplied to the circuits of the system A and the drive signal $\phi Y$ of the system B is supplied to the circuits of the system B, involve the following problems. At the start of or during the serial access, if a start address of the serial access must be designated, one of the systems A and B must be started earlier than the other according to the least significant bit (LSB) of the serial access at that time. In the conventional serial access system of the memory device, however, the systems A and B alternately operate according to serial access control signal SC, and it is impossible to start the system A or B in a desired operation cycle. For this reason, the conventional memory device cannot execute various applied operations of the serial access, such as designation of the serial start address, and jump during the serial access.

As described above, in the conventional serially-accessed semiconductor memory device which uses the two data selecting/fetching systems and alternately operates them for data fetching, it is impossible to start a desired one of those two systems earlier than the other in a desired operation cycle. Therefore, the conventional memory device cannot execute the various applied operations of the serial access.

SUMMARY OF THE INVENTION

Accordingly, an object of this invention is to provide a serially-accessed semiconductor memory device in which any of the two selecting/fetching systems can be first started for serial access in a desired operation cycle, and which can execute various types of applied operations based on the serial access.

According to this invention, there is provided a serially-accessed type memory device comprising drive signal generating circuits for generating first drive signals with different phases to control the data selecting/fetching systems, according to serial access control signal, and a select circuit for selecting one of first drive signals and applying the selected first drive signal to the two data selecting/fetching systems.

The semiconductor memory device determines a level of a select control signal according to a level of drive signals for two systems as generated in the preceding access cycle, and a level of the least significant bit of an address to fetch data in a desired serial access cycle. According to this select signal, a select circuit selects one of the drive signals as generated by drive signal generating circuits, and supplies the selected signal to two data selecting/fetching systems. The function of this select circuit allows one of the two data selecting/fetching systems to first start the data access operation.

BRIEF DESCRIPTION OF THE DRAWINGS

FIG. 1 is a block diagram of a conventional serially accessed type semiconductor memory;

FIG. 3 is a block diagram of a major part of a serially-accessed type semiconductor memory device according to this invention;

FIG. 4 is a circuit diagram of a select circuit used in the semiconductor memory device of FIG. 3;

FIG. 5 shows a table showing level relationships among drive signals input to the select circuit of FIG. 4, select control signals, and drive signals output from the select circuit;

FIG. 6 shows a select control signal generator for generating a select control signal to be input to the select circuit of FIG. 4;

FIG. 8 is a circuit diagram of the select circuit used in the FIG. 3 memory device according to this invention.

DETAILED DESCRIPTION OF THE PREFERRED EMBODIMENTS

Figure 2:
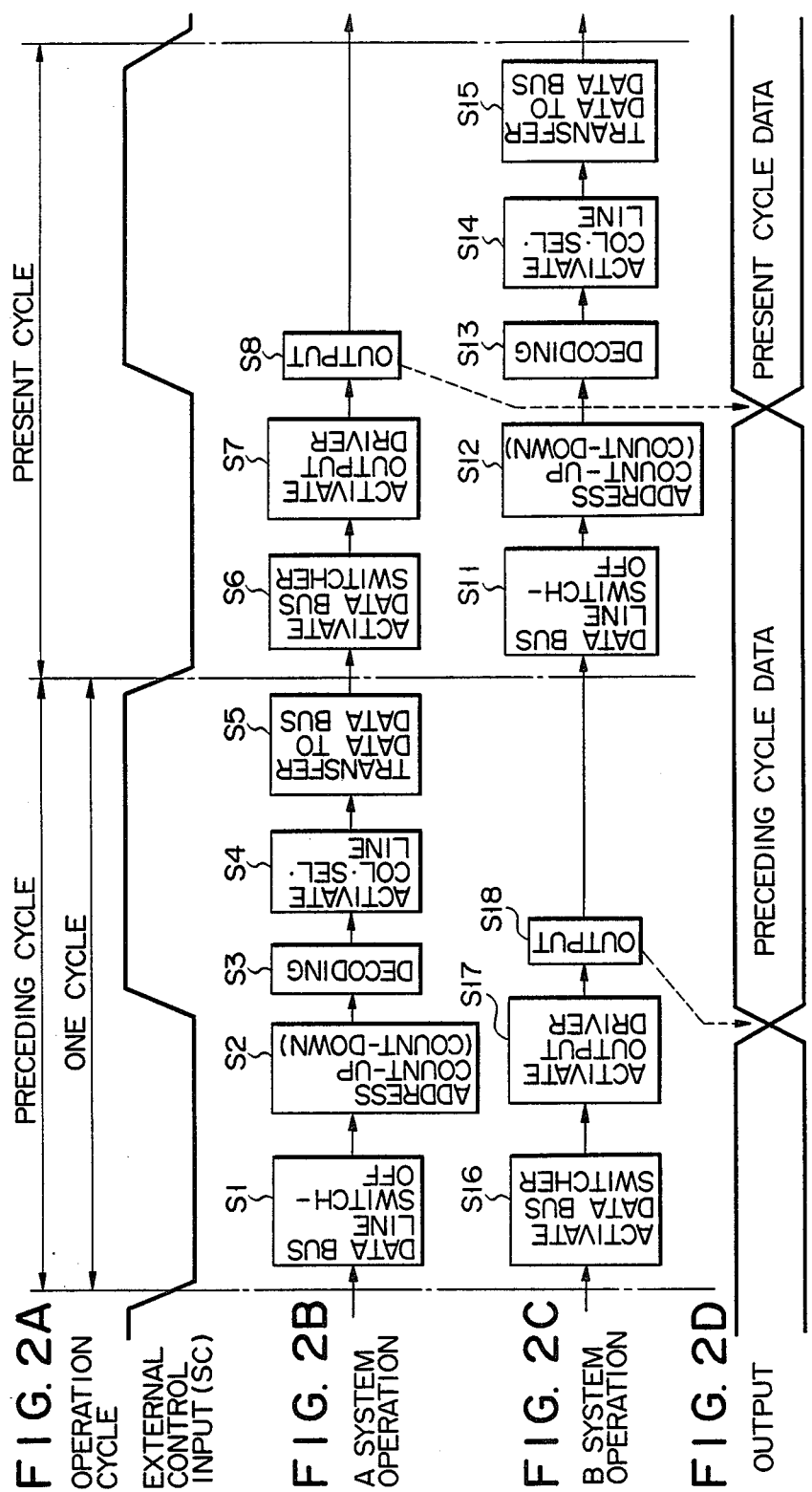
FIGS. 2A to 2D are flowcharts for illustrating the data read operation by the semiconductor memory device shown in FIG. 1.

Preferred embodiments of this invention will be described referring to the accompanying drawings.

In FIG. 3, like portions are designated by like reference symbols in FIG. 1 illustrating the conventional circuit arrangement, for simplicity of illustration. A serially-accessed semiconductor memory device comprises two data selecting/fetching systems A and B. Each of the systems A and B is made up of a data register (51 or 52), a column select line (CA or CB), a column select gate (53 or 54), data buses (DBA and $\overline{DBA}$ or DBB or $\overline{DBB}$), a drive signal generator (56 or 58), a serial address generator (55 or 57), an address decoder (59 or 60), a column select gate driver (61 or 62) and a data bus select gate (63 or 64). This memory device is based on the interleave access system in which the system A, for example, sets up data to be outputted, while the system B is outputting data.

As shown in FIG. 3, the memory device of this embodiment uses a select circuit inserted between a pair of drive signal generators 56 and 58 and a pair of serial address generators 55 and 57. According to select control signals "$\alpha$" and "$\overline{\alpha}$", the select circuit selects a drive signal $\phi X$ generated by drive signal generator 56 and applies it to serial address generators 55 or 57 of both the systems A and B. Likewise, the select circuit selects a drive signal $\phi Y$ generated by drive signal generator 58 and applies it to serial address generators 55 or 57 of both the systems A and B.

In FIG. 4, there is shown a circuit diagram of select circuit 10. As shown, the sources or drains of N channel MOS transistors 11 and 12 are connected together. The connection point is coupled for reception with drive signal $\phi X$ from drive signal generator 56. Similarly, the sources or drains of N channel MOS transistors 13 and 14 are connected together. The connection point is coupled for reception with drive signal $\phi Y$ from drive signal generator 58. The sources or drains of MOS transistors 11 and 14 are connected together. The signal at this connection point is output as drive signal $\phi A$ to serial address generator 55 in the system A. Similarly, the sources or drains of MOS transistors 12 and 13 are connected together. The signal at this connection point is output as drive signal $\phi B$ to drive signal generator 57 in the system B. The gates of MOS transistors 11 and 13 are coupled for reception with select control signal "$\alpha$", while the gates of MOS transistors 12 and 14 are coupled for reception with select control signal "$\overline{\alpha}$", which is the inversion of the signal "$\alpha$".

The levels of these control signals "$\alpha$" and "$\overline{\alpha}$" are set as shown by a table of FIG. 5. At the start of a desired serial access cycle or during the serial access cycle, when a new serial address is designated, the drive signals $\phi X$ and $\phi Y$ as generated in the preceding access cycle are denoted as φX' and φY', respectively. AO or BO indicate the levels of the least significant bit of the new serial address. The levels of select control signals "α" and "ᾱ" may be set by a circuit as shown in FIG. 6. Control signal "α" is formed by inputting the drive signal φX' and the LSB AO of the new serial address to exclusive OR gate 21. When the control signal "α" thus obtained is passed through inverter 22, the control signal "ᾱ" is obtained.

The operation of the memory device thus arranged will be described referring FIGS. 7A to 7H.

Figure 7:
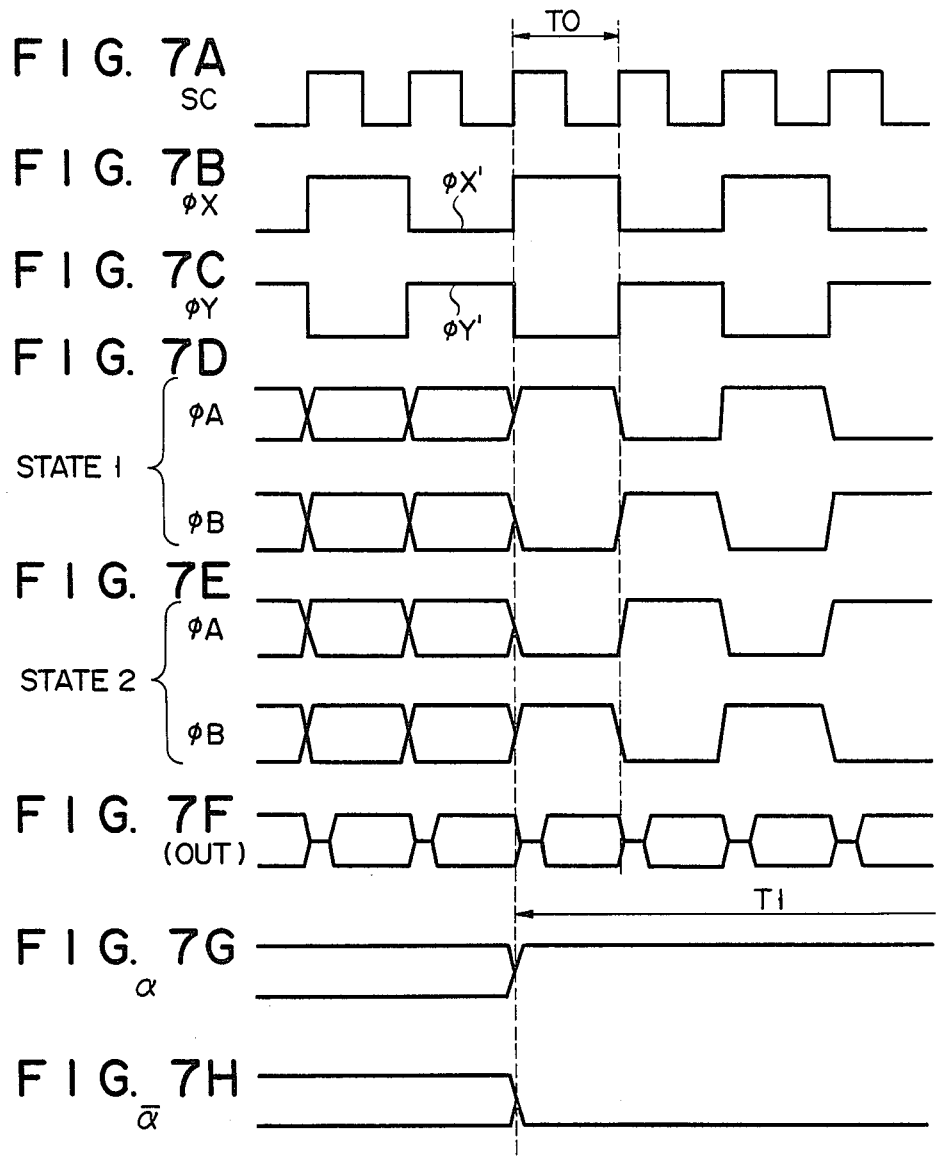
FIGS. 7A to 7H show timing charts used in explaining the operation of the memory device shown in FIG. 3.

According to serial access control signal SC shown in FIG. 7A, drive signal generators 56 and 58, respectively, generate drive signals φX and φY at the period twice as long as that of control signal SC, and with different phases. Serial address generators 55 and 57 set addresses according to the drive signals φA and φB which are applied to serial address generators 55 and 57, from select circuit 10. In this way, the interleave serial access is performed for reading out data.

It is assumed now that a desired address is designated in period T0 (FIGS. 7A to 7F). To designate an address implies one of two cases; the system A first outputs data in the succeeding serial access cycle or the system B first outputs in the same cycle. State 1 shown in FIG. 7D indicates the case that the system A first outputs data in the addressed cycle. State 2 shown in FIG. 7E indicates the case that the system B first outputs data in the addressed cycle. In the cycle before period T0, the system to first output data cannot be specified. For this reason, those figures illustrate both the cases that drive signals φA and φB are logical "0" and "1". It is assumed that when the "1" level of drive signals φX or φY are applied to serial address generators 55 and 57, the systems A and B are in a data outputting condition.

It is assumed now that when it is state "1", an address to cause the system A to output data in period T0 is designated. In this case, the LSB AO of this serial address is logical "1". The drive signals φX' and φY' in the cycle preceding to period T0 are logical "0" and "1", respectively (FIGS. 7B and 7C). Therefore, control signals "α" and "ᾱ" become logical "1" and "0" in level, as seen from the FIG. 5 table. At this time, in the select circuit of FIG. 4, transistors 11 and 13 are turned on. Drive signal φX as generated by drive signal generator 56 is input as signal φA to serial address generator 55. Similarly, drive signal φY as generated by drive signal generator 58 is input as signal φB to serial address generator 57. Accordingly, during period T1 starting at period T0, the system A first outputs data.

In state 2, an address to cause the system B to output data in period T0. At this time, the LSB AO of this address is logical "0". Control signals "α" and "ᾱ" are logical "0" and "1", as shown in FIG. 5. In the select circuit of FIG. 4, transistors 12 and 14 are turned on. Drive signal φX generated by drive signal generator 56 is input as signal φB to address generator 57. Similarly, drive signal φY generated by drive signal generator 58 is input as signal φB to address generator 55. Thus, in state 2, the system B first outputs data in serial access period T1 starting at period T0.

As seen from the foregoing, in a designated access cycle, any of the systems A and B may first operate to output data. Therefore, the memory device according to this invention can executes various types of applied operations of the serial access, such as designation of the serial top address, and jump during the serial access operation. Since the memory device is based on the interleave access system, a high speed access is secured.

In the above-mentioned embodiment, select circuit 10 selects one of the drive signals generated by drive signal generators 56 and 58, and supplies it to serial address generators 55 or 57. The function of this circuit 10 is applicable to other drive signals generated by drive signal generators 56 and 58, such as drive signals to control other circuits of the systems A and B. Such drive signals are those for selectively activating column select gates 53 and 54, and data bus column select gates 63 and 64.

FIG. 8 shows a modification of the select circuit of FIG. 3.

In the figure, the output terminal of inverter 81 is connected to the input terminal of clocked inverter 83, and the output terminal of inverter 82 is connected to the input terminal of clocked inverter 84. The connection point of the output terminal of inverter 81 and the input terminal of clocked inverter 83 is connected to the input terminal of clocked inverter 85. The connection point of the output terminal of inverter 82 and the input terminal of clocked inverter 84 is connected to the input terminal of clocked inverter 86.

The output terminal of clocked inverter 85 is connected to the output terminal of clocked inverter 84, and the output terminal of clocked inverter 86 is connected to the output terminal of clocked inverter 83.

In the select circuit thus arranged, drive signal φX is applied to the input terminal of inverter 81, and drive signal φY is applied to the input terminal of inverter 82. Select control signals "α" and "ᾱ" are applied to the control terminals of clocked inverters 83 to 86, as shown in FIG. 8.

The select circuit of FIG. 8 produces drive signals φA and φB, as in the FIG. 4 select circuit. The serially-accessed type memory device may operate according to these drive signals, as in the FIG. 4 case.

It is evident that the N channel MOS transistors in the FIG. 4 select circuit may be replaced by P channel MOS transistors, if necessary.

What is claimed is:

1. A serially-accessed type memory device comprising:
   first and second data selecting/fetching systems for alternately selecting and fetching data in a serial access manner;
   a first drive signal generating circuit for generating a first drive signal, to control said first and second data selecting/fetching systems, according to a serial access control signal;
   a second drive signal generating circuit for generating a second drive signal, to control said first and second data selecting/fetching systems, according to a serial access control signal, wherein the second drive signal is in inverse relation to the first drive signal;
   a select circuit for alternately outputting said first and second drive signals from two output terminals in response to a select control signal;
   a first serial address generating circuit for inputting one of said first and second drive signal from said select circuit; and
   a second serial address generating circuit for inputting the drive signal from said select circuit that is in inverse relation to the drive signal input to said first serial address generating circuit.

2. A serially-accessed typed memory device comprising:
- two data selecting/fetching systems for alternately selecting and fetching data in a serial access manner;
- drive signal generating circuits for generating first drive signals having different phases, to control said data selecting/fetching systems, according to a serial access control signal; and
- a select circuit for selecting one of said first drive signals and applying the selected first drive signal to said two data selecting/fetching systems;
- wherein said select circuit is so arranged that when an address is designated in a desired serial access cycle, for data to be fetched, said select circuit selects one of said first drive signals according to a state of the least significant bit of said address, and a state of the second drive signals as generated by said drive signal generating circuit before said desired serial access cycle.

3. A serially-accessed type memory device comprising:
- a first serial address generating circuit constituting a first data selecting/fetching system for alternately selecting and fetching data in a serial access manner;
- a second serial address generating circuit constituting a second data selecting/fetching system for alternately selecting and fetching data in a serial access manner;
- a first drive signal generating circuit for generating a first signal, to control said first and second data selecting/fetching system, according to a serial access control signal;
- a second drive signal generating circuit for generating a second drive signal, to control said first and second data selecting/fetching systems, according to said serial access control signal, wherein said second drive signal is in inverse relation to said first drive signal; and
- a select circuit for alternately outputting said first and second drive signals from a first and a second output terminal to said first and second serial address generating circuits, respectively, in response to a select control signal.

4. A serially-accessed type memory device comprising:
- a serial address generating circuit constituting two data selecting/ fetching systems for alternately selecting and fetching data in a serial access manner;
- drive signal generating circuits for generating first drive signals having different phases, to control said data selecting/fetching systems, according to serial access control signal; and
- a select circuit for selecting one of said first drive signals and applying the selected first drive signal to said two data selecting/fetching systems;
- wherein said select circuit is so arranged that when an address is designated in a desired serial access cycle, for data to be fetched, said select circuit selects one of said first drive signals according to a state of the least significant bit of said address, and a state of the second drive signals as generated by said drive signal generating circuit before said desired serial access cycle.

5. A serially-accessed type memory device comprising:
- a first and a second data selecting/fetching system for alternately selecting and fetching data in a serial access manner during serial access cycles;
- a first drive signal generating means for generating a first drive signal in response to a serial access control signal;
- a second drive signal generating means for generating a second drive signal in response to the serial access control signal, wherein the first and second drive signals are inverses of each other;
- means for generating a select control signal, in response to the level of the first and second drive signals during a preceding serial access cycle, and in response to the level of one of the bits in a serial address designated to fetch data in a desired serial access cycle;
- switching means, coupled to the first and second drive signal generating means and to the select control signal generating means, and having a first and a second output terminal, for alternately outputting, in response to the select control signal, the first and second drive signal at the first and second output terminals, respectively, and the first and second drive signals at the second and first output terminals, respectively;
- a first serial address generating means, coupled to the first output terminal and to the first data selecting/fetching system, for selecting a serial address for the first data selecting/fetching system during the desired serial access cycle in accordance with the drive signal output at the first output terminal; and
- a second serial address generating means, coupled to the second output terminal and to the second data selecting/fetching system, for selecting a serial a serial address for the second data selecting/fetching system during the desired serial access cycle in accordance with the drive signal output at the second output terminal.

* * * * *